US010373085B1

(12) United States Patent
Baghdikian

(10) Patent No.: US 10,373,085 B1
(45) Date of Patent: Aug. 6, 2019

(54) CONSTRAINT BASED RENEWABLE ENERGY SYSTEM CONFIGURATION

(71) Applicant: Reeco IP, LLC, Newport Beach, CA (US)

(72) Inventor: Daniel Shaunt Baghdikian, Anaheim, CA (US)

(73) Assignee: Reeco IP, LLC, Newport Beach, CA (US)

( * ) Notice: Subject to any disclaimer, the term of this patent is extended or adjusted under 35 U.S.C. 154(b) by 686 days.

(21) Appl. No.: 15/000,668

(22) Filed: Jan. 19, 2016

Related U.S. Application Data

(63) Continuation-in-part of application No. 14/943,551, filed on Nov. 17, 2015, now abandoned.

(Continued)

(51) Int. Cl.
*G06Q 50/06* (2012.01)
*G06Q 10/06* (2012.01)

(Continued)

(52) U.S. Cl.
CPC ... *G06Q 10/06313* (2013.01); *G06F 17/5004* (2013.01); *G06Q 30/0208* (2013.01); *G06Q 50/06* (2013.01)

(58) Field of Classification Search
CPC ............. G06F 17/5009; G06F 17/3024; G06F 17/5004; G06Q 30/0208; G06Q 30/0605;

(Continued)

(56) References Cited

U.S. PATENT DOCUMENTS 7,844,499 B2 11/2010 Yahiro et al.
9,053,275 B2 6/2015 Brier et al.

(Continued)

OTHER PUBLICATIONS

Hoen, B., Wiser, R., Cappers, P., and Thayer, M. "An Analysis of the Effects of Residential Photovoltaic Energy System on Home Sales Prices in California", Ernest Orlando Lawrence Berkeley National Laboratory, Environmental Energy Technologies Division, LBNL-4476E, downloaded from http://eetd.lbl.gov/ea/emp/reports/lbnl-4476e.pdf, Apr. 2011, 60 pgs.

(Continued)

*Primary Examiner* — Kandasamy Thangavelu
(74) *Attorney, Agent, or Firm* — Knobbe, Martens, Olson & Bear, LLP

(57) ABSTRACT

A method for installing a photovoltaic system is presented and may involve receiving an identity of a building, and accessing a data store to obtain physical characteristics of the building based on an address of the building. The method may also include accessing a second data store to obtain weather information for a geographic region that includes the building, determining an available installation area to install a photovoltaic system on the building based on the physical characteristics of the building, and calculating an installation area for the photovoltaic system based at least in part on the weather information and the available installation area to maximize average efficiency of photovoltaic cells within the photovoltaic system. Further, the method may include adjusting the size of the PV system based on a building specific non-energy based constraint.

20 Claims, 7 Drawing Sheets

Related U.S. Application Data

(60) Provisional application No. 62/082,039, filed on Nov. 19, 2014.

(51) Int. Cl.
*G06Q 30/02* (2012.01)
*G06F 17/50* (2006.01)

(58) Field of Classification Search
CPC ........... G06Q 50/06; G06Q 10/10; H02J 3/38; F24D 11/0221; H01L 31/05; H02S 10/10; E04H 6/025
See application file for complete search history.

(56) References Cited

U.S. PATENT DOCUMENTS

| | | | | |
|---|---|---|---|---|
| 2008/0091626 | A1 | 4/2008 | Kremen | |
| 2009/0132360 | A1 | 5/2009 | Arfin et al. | |
| 2009/0210329 | A1 | 8/2009 | Sade | |
| 2009/0228405 | A1 | 9/2009 | Lopez et al. | |
| 2009/0234692 | A1* | 9/2009 | Powell | G06F 17/30241 705/26.4 |
| 2010/0224234 | A1* | 9/2010 | Fischer | F24D 11/0221 136/248 |
| 2010/0293045 | A1* | 11/2010 | Burns | G06Q 30/0208 705/14.11 |
| 2011/0049992 | A1* | 3/2011 | Sant'Anselmo | H02S 10/10 307/64 |
| 2011/0205245 | A1* | 8/2011 | Kennedy | G06Q 10/10 345/636 |
| 2011/0303262 | A1* | 12/2011 | Wolter | H01L 31/05 136/251 |
| 2012/0016815 | A1* | 1/2012 | DeBartolo, III | E04H 6/025 705/500 |
| 2012/0150679 | A1* | 6/2012 | Lazaris | G06Q 30/0605 705/26.2 |
| 2012/0209681 | A1 | 8/2012 | Anderson | |
| 2012/0330759 | A1 | 12/2012 | Aggarwal et al. | |
| 2013/0166211 | A1* | 6/2013 | Kerrigan | G06Q 50/06 702/5 |
| 2014/0025343 | A1 | 1/2014 | Gregg et al. | |
| 2014/0149081 | A1 | 5/2014 | Hinners et al. | |
| 2014/0200861 | A1* | 7/2014 | DeVito | G06F 17/5004 703/1 |
| 2014/0265585 | A1* | 9/2014 | Della Sera | H02J 3/38 307/52 |
| 2014/0278108 | A1* | 9/2014 | Kerrigan | G01W 1/10 702/3 |
| 2015/0066442 | A1* | 3/2015 | Pryor | G06F 17/5009 703/1 |
| 2015/0196002 | A1* | 7/2015 | Friesth | A01G 22/00 47/62 R |

OTHER PUBLICATIONS

Klise, G.T., Johnson, J. L., and Adomatis, S. K., "Standardizing Appraisals for PV Installations", 9 pgs.

* cited by examiner

CONSTRAINT BASED RENEWABLE ENERGY SYSTEM CONFIGURATION

RELATED APPLICATIONS

This application is a continuation-in-part of U.S. application Ser. No. 14/943,551, filed Nov. 17, 2015 and titled "SYSTEM AND METHOD FOR SIZING AND INSTALLING A RENEWABLE ENERGY SOURCE FOR REAL ESTATE," which is hereby incorporated by reference in its entirety herein and which claims priority to U.S. Provisional Application No. 62/082,039, filed Nov. 19, 2014 and titled "SYSTEM AND METHOD FOR SIZING AND INSTALLING A RENEWABLE ENERGY SOURCE FOR REAL ESTATE," which is hereby incorporated by reference in its entirety herein. Further, any and all applications for which a foreign or domestic priority claim is identified in the Application Data Sheet as filed with the present application are hereby incorporated by reference under 37 CFR 1.57.

TECHNICAL FIELD

This disclosure generally relates to the layout and installation of a renewable energy system for a building. More specifically, this disclosure relates to an automated constraint-based configuration and installation of a renewable energy system.

BACKGROUND

Alternative energy systems have steadily increased in popularity over the years. Some alternative energy systems are based on renewable energy sources, such as wind or solar. Some building owners or managers install small wind farms to produce electricity and to help reduce a reliance on power companies and/or a regional or national energy grid. Further, some building owners or managers install a solar panel system or photovoltaic (PV) modules. Photovoltaic (PV) modules and related mounting hardware are generally well known and in widespread use. Users often opt to install PV systems for a variety of reasons. For example, some users desire to reduce monthly electricity expenditures while some other users desire to reduce their carbon footprint.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Embodiments of the present disclosure relate to systems and methods for facilitating the electrical design of an energy generation system or a renewable energy system. According to one embodiment, a method is provided that can comprise receiving, by a computer system from a user, first information pertaining to a real estate search, or in other cases an energy generation system to be installed at a building or other user location. The method can further comprise determining an electrical design for installing the energy generation system at the building, where the determining is based on the first information, second information retrieved from one or more external data sources, an electrical data model, and a decision tree that models the electrical design process. An installation diagram can then be generated that illustrates the determined electrical design.

According to another embodiment of the present disclosure, a system is provided that comprises a hardware processor. The hardware processor can be configured to receive, from a user, first information pertaining to an energy generation system to be installed at a property; determine an electrical design for installing the energy generation system at the property, the determining being based at least in part on the first information, second information retrieved from one or more external data sources, an electrical data model, and a decision tree modeling an electrical design process; and generate an installation diagram illustrating the determined electrical design.

According to another embodiment of the present disclosure, a non-transitory computer-readable storage medium is provided that has stored thereon program code executable by a computer system. The program code can comprise code that causes the computer system to receive, from a user, first information pertaining to an energy generation system to be installed at a physical location; code that causes the computer system to determine an electrical design for installing the energy generation system at the physical location, the determining being based on the first information, second information retrieved from one or more external data sources, an electrical data model, and a decision tree modeling an electrical design process; and code that causes the computer system to generate an installation diagram illustrating the determined electrical design.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION OF CERTAIN EMBODIMENTS

Introduction

Figure 1A:
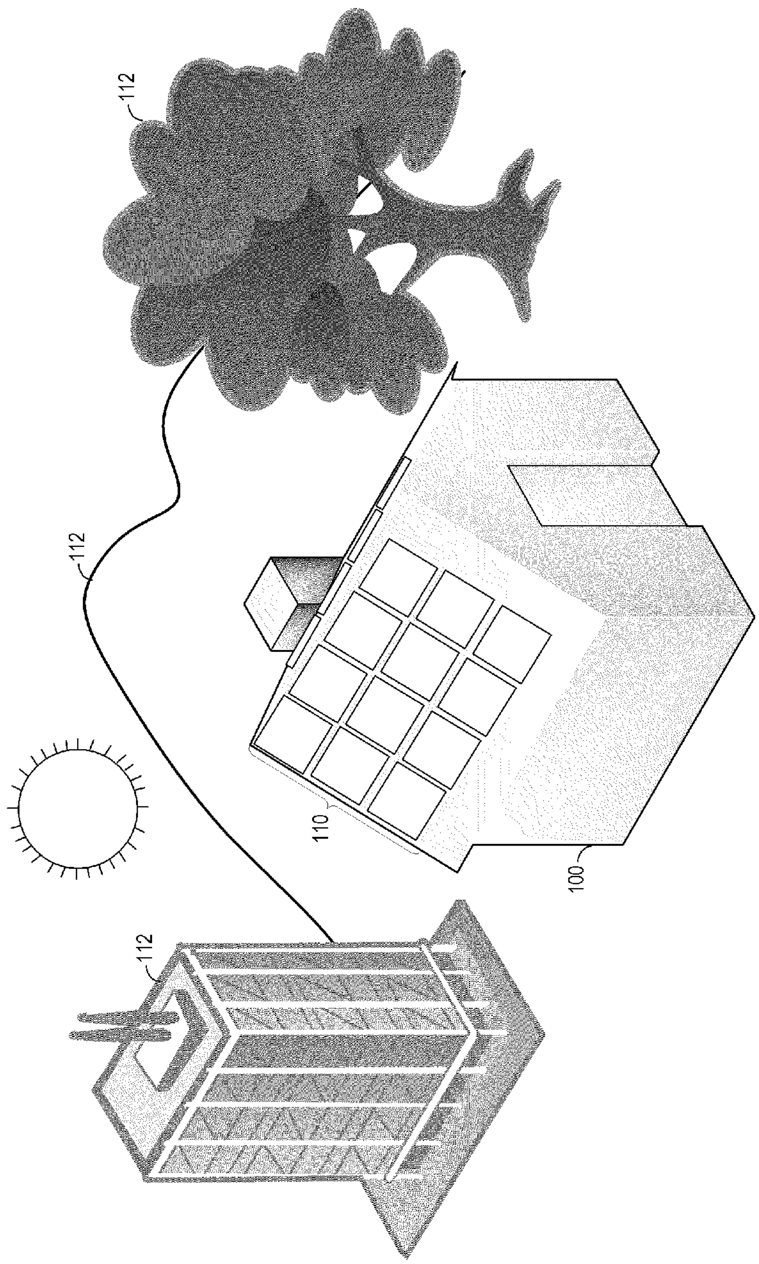
FIG. 1A is a pictorial diagram illustrating an example of a building including a maximally sized solar panel array layout.

Many users who desire the installation of renewable energy systems are not well-versed in the knowledge necessary to design a renewable energy system for property or buildings owned or managed by the users. Further, some users have specific constraints for the selection, configuration, or installation of the renewable energy system. In many cases, the constraints may be specific to the particular building or property. For example, in some cases, a user may desire that the renewable energy system satisfy specific aesthetic criteria, such as being un-viewable from a particular road or from a particular side of the property or building. As another example, a user may desire that the renewable energy system provide a particular percentage of electricity production in relation to the usage for the building over a particular time period. Often, the calculation of the electricity production may be challenging due to, for example, the lack of readily available data, deterioration in the renewable energy system, property-specific features that can increase energy usage by a threshold level (e.g., a heated pool), climate change (e.g., a change in the number of hours of rain or cloud cover), a change in the level of pollution in a particular geographic area.

Certain embodiments of the present disclosure include systems and methods for automatically configuring a layout, determining the cost, and setting a price for a renewable energy system based on one or more characteristics of a property and one or more additional constraints. In some embodiments, the renewable energy system may be automatically designed or configured without input from a user. In other embodiments, a user may specify one or more constraints for the configuration of the renewable energy system. The one or more additional constraints may be specific to a user and/or to the building. Further, the one or more additional constraints may be unrelated to an amount of energy or electricity produced by the renewable energy system. Alternatively, the one or more additional constraints may affect the energy or electricity produced by the renewable energy system, but determining whether the one or more additional constraints is satisfied may be independent from the impact on the amount of energy or electricity produced by the renewable energy system. For example, the reduction on the number of solar panels or the restriction on the location of wind turbines based on an aesthetic-related constraint may affect the amount of electricity generated, but a determination of whether the aesthetic-related constraint is satisfied may be unrelated to the amount of electricity generated. Another example is the application of local building codes or architectural guidelines imposed by the municipal Authority Having Jurisdiction (AHJ) or Home Owner Association (HOA), which can set requirements for path of travel or setback from the roofline. Information about these additional constraints may be accessed from a repository of local codes or community architectural guidelines.

As will be described in more detail herein, embodiments of the systems and processes of the present disclosure can configure a layout, determine a cost, and set a price for a renewable energy source that is specific to a property and that accounts for one or more property-specific constraints by accessing data from a plurality of sources. These sources can include data relating to the physical characteristics of the building, aerial imagery, the weather of a geographic area that includes the building, anticipated climate change for the geographic area, incentives or rebates offered by one or more entities or government organizations, multiple listing service or real estate listing or historical sale database, commissions offered by one or more brokers for the sale or purchase of the building and/or renewable energy system, environmental effects of production, installation, or use of one or more renewable energy systems, historical energy usage by other buildings in the geographic area, labor rates and worker compensation insurance premiums, transportation and shipping costs, municipal or AHJ fees, technical specifications of renewable energy equipment and components, renewable energy manufacture or distribution source's availability and pricing of equipment and components, optimal installation techniques and methods, utility company rate schedules, laws and regulations, bank interest and discount rates, average or market pricing of renewable energy systems, competitor pricing of renewable energy systems, and any additional data sources that may include data that impacts the configuration of a renewable energy system. In certain embodiments, systems described herein can use weight and/or combine data from one or more data sources to facilitate the configuration of the renewable energy system.

Moreover, one or more machine learning algorithms can be used to facilitate the configuration of the renewable energy system. For example, using training data relating to the installation of renewable energy sources within a particular geographic region, demographic, or socioeconomic class, a parameter function can be derived using machine learning algorithms. This parameter function can then be used to facilitate determining a layout of a renewable energy system for additional buildings or users. For instance, in a training stage, by providing building data characteristics (e.g., size, roof space, orientation with respect to the sun, etc.) and/or user characteristics (e.g., income, age, hobbies, etc.) to the machine learning algorithm as a set of inputs, and renewable energy system layouts as a set of outputs to the machine language algorithm, a parameter function can be derived. This parameter function can include different weights for different inputs or parameters of the parameter function. Once the parameter function is derived, inputs for additional buildings and/or users can be provided as inputs to the parameter function. The output of the parameter function can include data or probability values for the placement and sizing of renewable energy systems that are most likely to satisfy user or building constraints for the installation of the renewable energy system. User feedback provided over time and/or updated information for buildings within the geographic area can be applied to the machine learnings algorithms to update the parameter function over time.

Although embodiments of the present disclosure can be applied to a variety of types of property including agricultural property, parking lots, factories, commercial buildings, single or multiple unit residential buildings, etc., to simplify discussion, and not to limit the present disclosure, the present disclosure will be described with respect to buildings in general, unless stated otherwise. Further, although embodiments of the present disclosure can be applied to a variety of renewable energy systems, to simplify discussion, and not to limit the present disclosure, the present disclosure will be described with respect to solar or photovoltaic systems, unless stated otherwise.

Example Solar Panel Layout

FIG. 1A is a pictorial diagram illustrating an example of a building 100 including a maximally sized solar panel array 110 layout. The solar panel array 110 includes a plurality of solar panels and is configured to cover some or all surfaces of the building 100 capable of supporting a solar panel. For example, the solar panel array 110 may cover both sides of the roof of building 100. Further, although not illustrated, the solar panel 110 may cover additional structures associated with the building 100, such as a shed or parking structure. By maximizing the number of panels that can be included as part of the solar panel array 110, the amount of electricity generated by the solar panel array 110 can be maximized not accounting for other factors relating to the generation of the electricity, such as materials used for the solar panels or sun-blocking obstacles 112. As illustrated, some non-limiting examples of the sun-blocking obstacles 112 can include other buildings, trees, or mountains.

The solar panels of the solar panel array 110 are typically homogenous in size and may produce a varying amount of electricity based on the amount of exposure to the sun by each solar panel. For example, solar panels that are shielded from the sun by a tree for a portion of the day may produce less electricity than another panel that is not shaded by the sun. Thus, different panels may contribute a different percentage of the electricity used by inhabitants (e.g., owners, visitors, employees, residents, etc.) of the building 100. Moreover, the solar panel array 110 does not accommodate additional constraints that may be user or building specific. For example, assuming the left side of the building 100 faces the street while the right side of the building 100 does not face the street, the solar panel array 110 does not account for a constraint that the solar panel array 110 should be not viewed from the street. As a second example, suppose that a constraint is selected that the environmental impact of the solar panel array 110 should be zero or less. Further, suppose that a solar panel that receives direct sunlight for less than 2 hours a day on average has a negative impact on the environment due, for example, to materials and energy used to manufacture the solar panel. At least some of the panels in the solar panel array 110 may not satisfy the constraint due to the sun-blocking obstacles 112 (e.g., the tree and the additional building). As a third example, suppose that a constraint is selected that the economic return of the solar panel array 110 should be five years or less. If the solar panel array still only receives less than 2 hours of sunlight a day on average, then at least some of the panels in the solar panel array 110 may not satisfy the constraint due to the sun-blocking obstacles 112. Embodiments of the present disclosure can reconfigure a layout for the solar panel array, or other renewable energy source, to account for additional constraints.

Figure 1B:
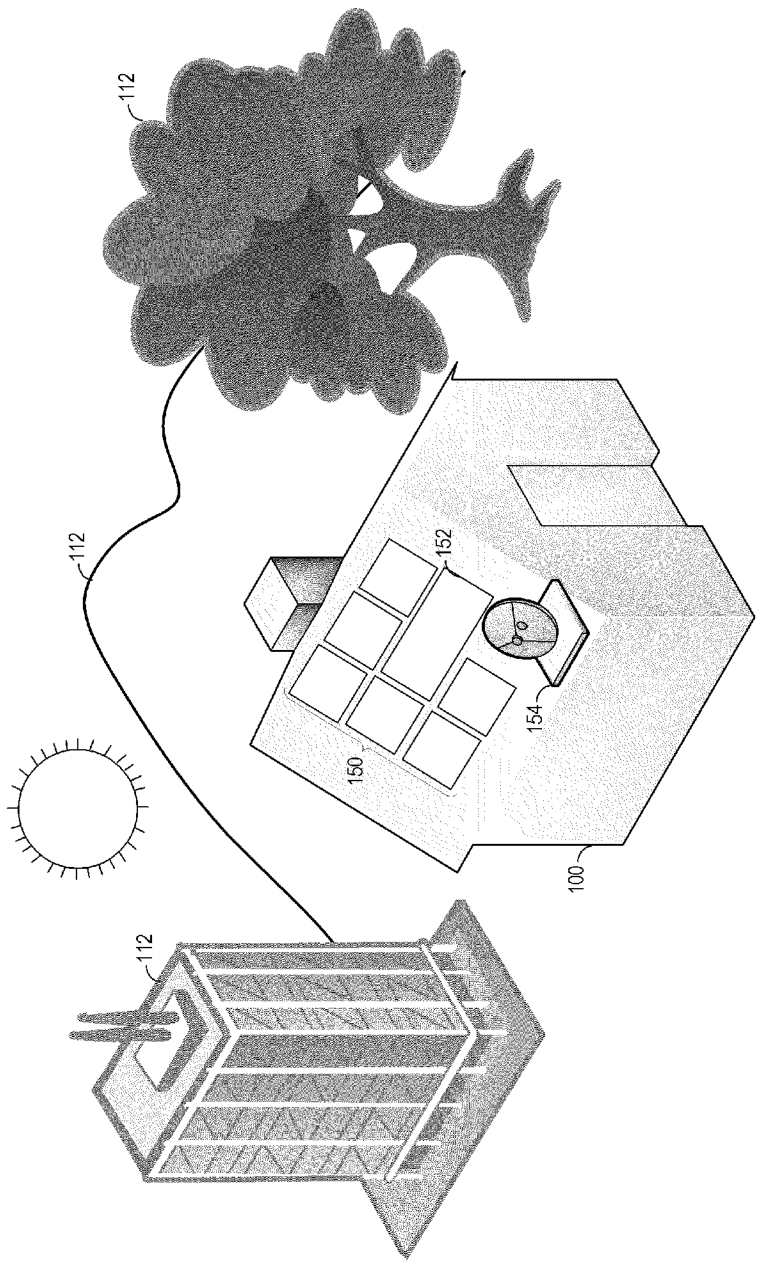
FIG. 1B is a pictorial diagram illustrating an example of a building including an alternative layout for a solar panel array based on one or more constraints.

FIG. 1B is a pictorial diagram illustrating an example of the building 100 from FIG. 1A including an alternative layout for a solar panel array 150 based on one or more constraints. As illustrated, the building 100 of FIG. 1B includes the same sun-blocking obstacles 112 as FIG. 1A. In addition, a user of the building 100 in FIG. 1B may desire to install a satellite receiver 154 for television communications. Using the processes and systems of the present disclosure, a layout for the solar panel array 150 may be created to account for constraints, such as the installation of the satellite receiver 154 or an existing photovoltaic (PV) system. Other constraints may include aesthetics; environmental effects, which may include the environmental effects of using and/or operating the renewable energy system and/or the environmental effects of manufacturing the renewable energy system; transaction source (e.g., tax credits or broker commissions); structural stability (e.g., structural impact on portions of the building by including the renewable energy system, structural impact on portions of the renewable energy system by adjusting the size of the renewable energy system, etc.), anticipated changes in electricity consumption (e.g., due to climate change, installation of a heated pool, installation of central air conditioning, addition of an extra room, etc.) anticipated climate change, availability and cost of equipment and components, etc. Some constraints may be energy-agnostic, or may be unrelated to the amount of electricity generated by the solar panel array 150, such as aesthetics, availability and cost of resources, such as labor. Some other constraints may or may not be related to electricity generated by the solar panel array 150, such as environmental effects.

As illustrated in FIG. 1B, a layout for the solar panel array 150 that is selected based on additional constraints may result in a small solar panel array than the solar panel array 110, which is designed to maximize the amount of solar panels installed on the building 100. Further, as illustrated by the solar panel 152, embodiments of the systems described herein can accommodate heterogeneous panel selection in the solar panel array 150 layout.

Example Networked Computing Environment

Figure 2:
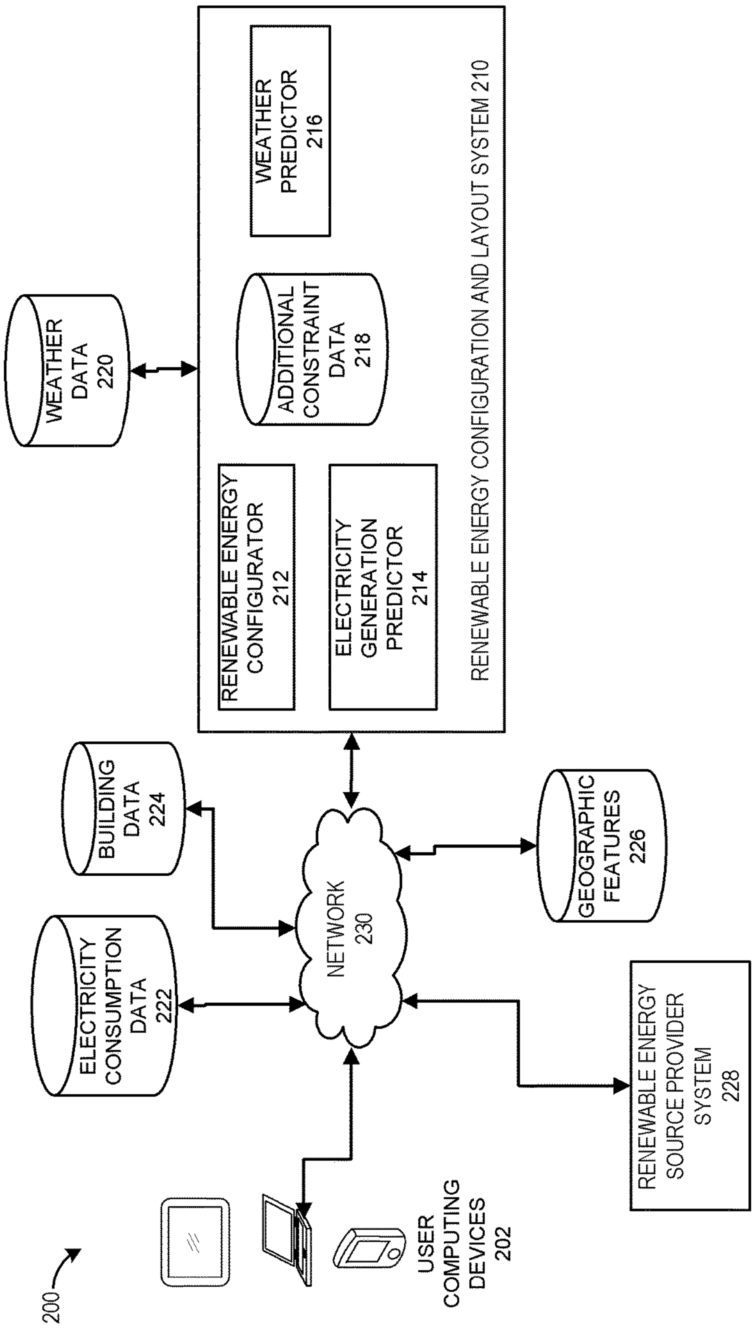
FIG. 2 is a block diagram illustrating an embodiment of a networked computing environment for implementing features described herein.

FIG. 2 is a block diagram illustrating an embodiment of a networked computing environment 200 for implementing features described herein. The networked computing environment 200 includes a renewable energy configuration and layout system 210 that can determine a layout for and/or configure a renewable energy system, such as a photovoltaic (PV), or solar panel, system. The renewable energy configuration and layout system 210 can access a number of data sources to obtain information relating to a building for determining a potential size and/or layout for the PV system. In some embodiments, the renewable energy configuration and layout system 210 may access the data sources directly, such as the weather data repository 220. In other embodiments, the renewable energy configuration and layout system 210 may access the data sources via a network 230, such as the building data repository 224. To simplify discussion, and not to limit the present disclosure, the renewable energy configuration and layout system 210 may also be referred to as the "configuration system 210" herein.

The configuration system 210 includes a renewable energy configurator 212, an electricity generation predictor 214, a weather predictor 216, and an additional constraint data repository 218. In some embodiments, the configuration system 210 can be implemented as hardware. For example, the configuration system 210 may be a server system or a distributed computing system. In other embodiments, the configuration system 210 may be implemented as software or computer-implemented instructions that are configured to execute in hardware. Further, in some embodiments, the systems included in the configuration system 210 may be implemented in hardware, in software, or in a combination of hardware and software. In some implementations, the configuration system 210 may include an arrangement of computer hardware and software components as previously described that may be used to implement aspects of the present disclosure. The configuration system 210 may include many more (or fewer) elements than those illustrated. It is not necessary, however, that all of these elements be shown in order to provide an enabling disclosure. Further, the configuration system 210 may include a processing unit, a network interface, a computer readable medium drive, an input/output device interface, a display, and an input device, all of which may communicate with one another by way of a communication bus. The network interface may provide connectivity to one or more networks or computing systems. The processing unit may thus receive information and instructions from other computing systems or services via the network 230. The processing unit may also communicate to and from memory and further provide output information for an optional display via the input/output device interface. The input/output device interface may also accept input from the optional input device, such as a keyboard, mouse, digital pen, microphone, touch screen, gesture recognition system, voice recognition system, image recognition through an imaging device (which may capture eye, hand, head, body tracking data and/or placement), gamepad, accelerometer, gyroscope, or other input device known in the art.

The memory may contain computer program instructions (grouped as modules or components in some embodiments) that the processing unit executes in order to implement one or more embodiments. The memory may generally include RAM, ROM and/or other persistent, auxiliary or non-transitory computer-readable media. The memory may store an operating system that provides computer program instructions for use by the processing unit in the general administration and operation of the interaction service. The memory may further include computer program instructions and other information for implementing aspects of the present disclosure. For example, in one embodiment, the memory includes a user interface module that generates user interfaces (and/or instructions therefor) for display upon a computing device, e.g., via a navigation interface such as a browser or application installed on the computing device. In addition, the memory may include or communicate with an one or more internal and/or external repositories or data stores including those described herein.

Further, although certain examples are illustrated herein in the context of a configuration system 210 that communicates with a separate user computing device 202, this is not a limitation on the systems and methods described herein. It will also be appreciated that, in some embodiments, a user computing device 202 may implement functionality that is otherwise described herein as being implemented by the elements and/or systems of the configuration system 210. For example, the user computing devices 202 may provide access to information about a building 100, or renewable energy configuration constraints with or without communicating with a separate network-based system, according to some embodiments.

The renewable energy configurator 212 can generally include one or more systems for configuring a renewable energy system for a building 100. Configuring the renewable energy system may include selecting a layout for the renewable energy system, selecting components for the renewable energy system (e.g., solar panels, inverters, connection hardware, etc.), and/or accounting for one or more energy and/or non-energy based constraints for selecting and/or installing the renewable energy system. In some cases, the renewable energy configurator 212 may access one or more repositories to obtain constraint data for configuring the renewable energy system.

In some cases, the renewable energy configurator 212 may include an anticipated or predicted electricity generation determination for a particular renewable energy system in determining the configuration of the renewable energy system. The predicted electricity generated by the particular renewable energy system layout may be determined by the electricity generation predictor 214, which can generally include one or more systems for predicting an amount of electricity generated by the renewable energy system. The predicted amount of electricity generated by the renewable energy system may be determined based on a number of factors. Further, the electricity generation predictor 214 may utilize one or more machine learning algorithms for predicting the amount of electricity generated by a particular renewable energy system layout or design. Factors that may be used to predict the amount of electricity generated may include specifications for particular renewable energy system elements, electricity generated by renewable energy systems installed on other buildings within a particular geographic area that includes the building 100, whether and/or climate data for the geographic area, geographic features within the geographic area that includes the building 100, and other factors that may impact electricity generated by a particular renewable energy system for a particular building.

The weather predictor 216 can generally include one or more systems for predicting the weather within a particular geographic area. In some cases, the weather predictor 216 can adjust a weather prediction based on climate change data. Moreover, the weather predictor 216 may access a weather data repository 220 that may include historical weather data, weather prediction patterns, climate change data, and/or other data that may be used to predict the weather for a particular time period within a particular geographic area. Further, the weather data repository may include information about average amount of sunlight and/or average amount of wind or wind speed for a particular geographic area. As illustrated, the configuration system 210 may directly access the weather data repository 220. Alternatively, the configuration system 210 may access the weather data repository 220 via the network 230.

In addition, or as an alternative, to accessing one or more external data repositories for obtaining constraint data to configure a renewable energy system, the renewable energy configurator 212 may access an additional constraint data repository 218 to obtain data for configuring the renewable energy system. The additional constraint data repository 218 may include user and/or building specific constraint data, such as aesthetic information or transaction data, that may be used to configure or modify a configuration of the renewable energy system.

Some additional, non-limiting repositories that may be accessed by the configuration system 210 when configuring a renewable energy system may include an electricity consumption repository 222, a building data repository 224, or a geographic features repository 226. It should be understood that other data sources may be accessed in certain embodiments of the present disclosure. For example, the configuration system 210 may access one or more repositories that provide information relating to labor availability and/or costs; equipment and component availability, specifications, and/or costs; transportation and shipping availability and/or costs; municipal regulations and/or fees; product availability and pricing, utility rate schedules, laws and regulations for a specific political or geographic area; government and/or utility incentives, interest and discount rates, installation techniques and methods, average or market pricing of renewable energy systems, competitor pricing of renewable energy systems, and the like. Electricity consumption repository 222 may include data relating to the consumption of electricity by similar buildings to the building 100. In some cases, the similar buildings are limited to buildings within a particular geographic area. However, in other cases, the similar buildings may include buildings that share a classification with the building 100 regardless of the geographic location of the building. Further, in some cases, electricity consumption repository 222 may include data relating to the consumption of electricity by buildings that include a similar number or type of users as the prospective users of the building 100. For example, assuming the building 100 is to be occupied by a family of five, in predicting the electricity consumption of the building 100, the renewable energy configurator 212 may access electricity consumption data from the electricity consumption repository 222 for other buildings that house a family of five.

The building data repository 224 may include data relating to the physical characteristics of the building 100. For example, the building data repository 224 may include the square footage of the building 100, the number of rooms of the building 100, the roof area of the building 100, an estimated value of the building 100, energy consumption features of the building 100 (e.g., heated pools, fireplaces, barbecue or other outdoor kitchen features, etc.), and the square footage of the property that includes the building 100, among other features. Further, the building data repository 224 may include information about characteristics of other buildings with the same classification is the building 100 (e.g., commercial, residential, single family, multifamily, detached, etc.), within the same geographic areas the building 100, within a threshold square footage of the building 100. In some cases, the building data repository 224 may be an aggregation of a number of repositories. Further, in some cases, the building data repository 224 may be maintained by a number of separate or related entities. In some non-limiting embodiments, the building data repository 224 may be or may have access to the multiple listing service (MLS) repository or suite of services. The MLS is a suite of services that enables real estate brokers to provide information about buildings or real estate available for purchase or rent.

In certain embodiments, the configuration system 210 may generate an initial configuration for a renewable energy system based on features that may impact the amount of electricity generated and/or desired in order to replace a non-renewable energy source. For example, the initial configuration may be generated based on the size of the building 100, the available roof space of the building 100, the number of users of the building 100, and geographic features of the area that includes the building 100. An updated or modified configuration of the renewable energy system may subsequently be generated based on additional constraint information, which may or may not be related to the amount of electricity generated. For example, the additional constraint information may be related to aesthetics and or transaction information (e.g., broker commission, such as from real estate transfer, available for use in obtaining the renewable energy system). Advantageously, in certain embodiments, by performing a multi-stage configuration process that accommodates both energy-related and non-energy related constraint information, the penetration of renewable energy systems may be increased resulting in a reduced carbon footprint. Further, users who are hesitant to obtain a renewable energy system or who are less knowledgeable about renewable energy systems may configure and obtain a renewable energy system. Further, by using machine learning algorithms to facilitate in the generation of renewable energy system configurations, computing resources in designing a renewable energy system may be reduced. In addition, the machine learning algorithms can be used to determine user preferences, some of which may be unexpected for a particular area, in the configuration of renewable energy systems. These user preferences may be used to configure more appealing renewable energy systems facilitating increased penetration of renewable energy systems in particular geographic areas. The increase in the use of renewable energy systems may help reduce the existence of climate change by switching more users to alternative renewable energy systems.

The geographic features repository 226 may include information about the geography of an area that includes the building 100. In particular, the geographic features repository 226 may include information about geographic features that may impact the electricity generation of the renewable energy system. For example, the geographic features repository 226 may include information about elevation, mountains, valleys, trees (including, for example, woods or forests), and any other information about geographic features that may impact electricity generation of the renewable energy system.

In some embodiments, the renewable energy configurator 212 may use information relating to the availability of and the specifications for various component elements of a renewable energy system. This information may be obtained, for example, from a renewable energy source provider system 228. Further, renewable energy source provider system 228 may be associated with a manufacturer and/or installer of renewable energy systems. In certain embodiments, the configuration system 210 may initiate the manufacture and/or installation of the renewable energy system by, for example, providing the renewable energy configuration and/or layout to the renewable energy source provider system 228.

One or more users may access the configuration system 210 using, for example, one or more user computing devices 202. These users may include administrators or employees of an entity that manages or owns the configuration system 210. Further, the users may include one or more users who are considering obtaining access to the building 100 by, for example, purchasing or leasing the building 100 or a portion thereof. The user computing system 110 may include any type of computing system. For example, the user computing system 110 may include any type of computing device(s), such as desktops, laptops, video game platforms, television set-top boxes, televisions (for example, Internet TVs), network-enabled kiosks, car-console devices, computerized appliances, wearable devices (for example, smart watches and glasses with computing functionality), and wireless mobile devices (for example, smart phones, PDAs, tablets, or the like), to name a few.

The network 230 may be a publicly accessible network of linked networks, possibly operated by various distinct parties. Further, in some cases, the network 230 may include the Internet. In other embodiments, the network 230 may include a private network, personal area network, local area network, wide area network, cable network, satellite network, cellular telephone network, etc., or combination thereof, each with access to and/or from an external network, such as the Internet.

Example Initial Renewable Energy System Configuration Process

Figure 3:
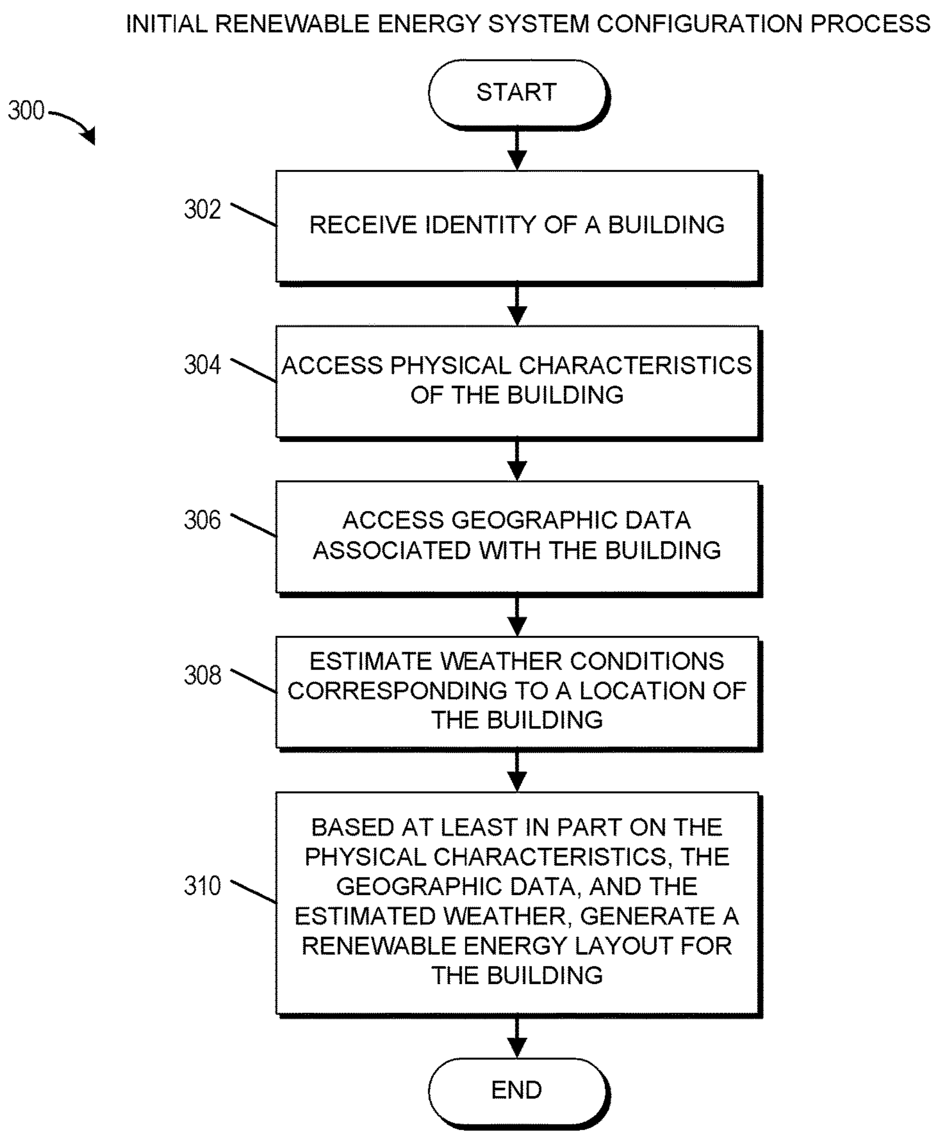
FIG. 3 is a flowchart for an embodiment of an initial renewable energy system configuration process.

FIG. 3 is a flowchart for an embodiment of an initial renewable energy system configuration process 300. The process 300 can be implemented by any system that can generate a renewable energy system configuration and/or layout based on one or more characteristics that may affect the efficiency of the renewable energy system and/or the amount of electricity generated by the renewable energy system. For example the process 300, in whole or in part, can be implemented by the renewable energy configuration and layout system 210, the renewable energy configurator 212, the electricity generation predictor 214, and/or the weather predictor 216, to name a few. Although any number of systems, in whole or in part, can implement the process 300, to simplify the discussion, portions of the process 300 will be described with reference to particular systems.

The process 300 begins at block 302 where, for example, the configuration system 210 receives an identity of a building (e.g., the building 100). The identity of the building may include an address, latitude and longitude coordinates, global positioning system (GPS) coordinates (or other satellite positioning or location data), a name of the building, or any other identification information that may be associated with the building. Further, did any of the building may be received from a user computing device 102, from an end-user, from an administrator, or may be automatically identified by the configuration system 210 by, for example, accessing a repository of building information (e.g., the building data repository 224).

At block 304, configuration system 210 accesses physical characteristics of the building. Accessing the physical characteristics of the building may include accessing the characteristics from the building data repository 224. The physical characteristics may include any information that may impact the installation or support of the renewable energy system with respect to the building. For example, the physical characteristics may include various dimensions of the building, such as a roof area, or an unobstructed roof area, a number of rooms, a number of rooms of a particular type (e.g., bedrooms), and other physical specifications of the building. Further, the physical characteristics may include a slope of the roof, a total weight supported by the roof, the location of loadbearing elements in the building, and any other characteristics that may impact the ability of the building to physically support the installation of a renewable energy system.

At block 306, the configuration system 210 accesses geographic data associated with the building by, for example, accessing the geographic features repository 226. The geographic features may include any type of geographical information that can affect the operation of the renewable energy system. For example, the geographic features may include mountains, hills, trees on or within a threshold distance of the building, and the like. Further, the geographic features may include geographic features that are located within a threshold distance of the building. In addition, the geographic features may include man-made features, such as other buildings.

Using, for example, the weather predictor 216, the configuration system 210 estimates weather conditions corresponding to a location of the building at block 308. Estimating the weather conditions may include accessing the weather data repository 220. Further, the weather predictor 216 may use historical weather information as well as a geographic location of the building, the amount of direct sunlight received throughout the year by different portions of the building, the amount of average cloud cover throughout the year, predicted climate change, and any other weather-related information that may impact the effectiveness of the renewable energy system.

Based at least in part on the physical characteristics, the geographic data, and the estimated weather obtained of the blocks 304, 306, and 308 respectively, the renewable energy configurator 212 generates a renewable energy system layout for the building at block 310. Generating the renewable energy system layout may include selecting components for the renewable energy system as well as positioning the different components of the renewable energy system with respect to portions of the building. In certain embodiments, the block 310 may include generating the maximally supported renewable energy system for the building 100. Further, in certain embodiments, one or more of the blocks 304, 306, 308 may be optional or omitted. For example, in some cases, the renewable energy system may be configured based solely on the physical characteristics of the building obtained at the block 304. In other cases, the renewable energy system may be configured based on the physical characteristics of the building in the direction of the building with respect to the sun.

Example Constraint Based Renewable Energy System

Figure 4:
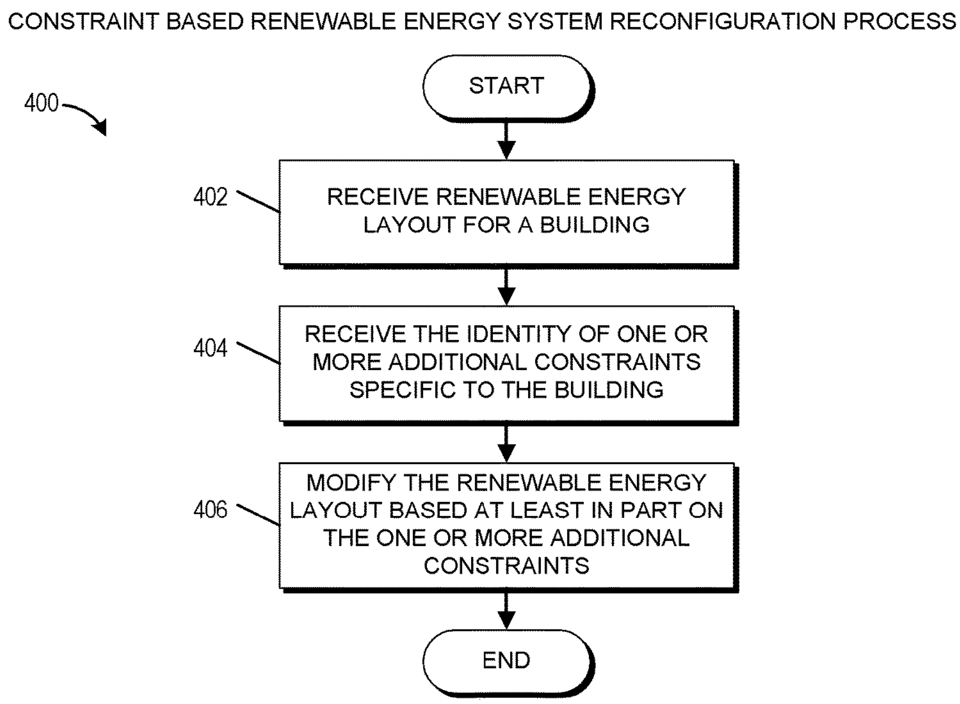
FIG. 4 is a flowchart for an embodiment of a constraint based renewable energy system reconfiguration process.

FIG. 4 is a flowchart for an embodiment of a constraint based renewable energy system reconfiguration process 400. The process 400 can be implemented by any system that can generate or reconfigure a renewable energy system design or layout based on one or more additional constraints. For example the process 400, in whole or in part, can be implemented by the renewable energy configuration and layout system 210, the renewable energy configurator 212, the electricity generation predictor 214, and/or the weather predictor 216, to name a few. Although any number of systems, in whole or in part, can implement the process 400, to simplify the discussion, portions of the process 400 will be described with reference to particular systems.

The process 400 begins at block 402 where, for example, the configuration system 210 receives a renewable energy layout for a building. In some cases, renewable energy layout is generated by the configuration system 210 using, for example, the process 300. Further, in some embodiments, the process 400 may be performed as part of the process 300.

At block 404, the configuration system 210 receives the identity of one or more additional constraints specific to the building. Typically, although not necessarily, the one or more additional constraints are unrelated to the amount of energy generated by the renewable energy system. For example, the one or more additional constraints may relate to the aesthetics, the transaction or payment source for the renewable energy system, or an installation time period available for installing renewable energy system. In other cases, the one or more additional constraints may be related to the amount of energy or electricity produced by the renewable energy system. For example, an additional constraint may be based on an additional measure or unit of electricity produced by a portion of the renewable energy system. In other words, in certain cases, an additional constraint may be based on a Delta value for an amount of electricity produced by an additional solar panel. It should be understood that the Delta value will vary based on the specific solar panel added in its location within the renewable energy layout because, for example, each additional solar panel will be located in a different location with respect to the building and will thus receive a different amount of sunlight throughout the day and with respect to different weather conditions.

At block 406, configuration system 210 modifies the renewable energy layout based at least in part on the one or more additional constraints. For example, if the additional constraint relates to preventing solar panels being visible in the front of the building, the configuration system 210 may adjust the configuration of the renewable energy layout to remove solar panels that are visible from the front of the building. In some embodiments, the removal of solar panels from the front of the building may include modifying selected equipment for the remainder of the renewable energy layout to accommodate for the reduction in solar panels within the renewable energy layout.

As another example, the additional constraint may require that the cost of the renewable energy system does not exceed a commission or a portion of a commission received by a broker involved in the transfer of ownership of the building between two users. For instance, in an effort to convince a user to use the broker services, the broker may offer reduced or free electricity for a time period to a purchaser of the building. To offer the free electricity, the broker may subsidize in part or in full the cost of the renewable energy system using the broker's commission, which may be a percentage of the sales price of the building, for facilitating the sale of the building. In such a case, renewable energy layout may be modified such that the price for the renewable energy system is within the percentage of the commission used by the broker to subsidize the renewable energy system. The broker may recoup the cost of the renewable energy system through a number of methods including, for example, rebates offered by one or more governmental agencies or by an electricity providing entity, such as a power plant. Alternatively, or in addition, the broker may recoup the costs renewable energy system by receiving at least a portion of the sales price of an electricity produced by the renewable energy system that is sold to a power plant or a manager of a power grid.

Example Electricity Reduction Estimation Process

Figure 5:
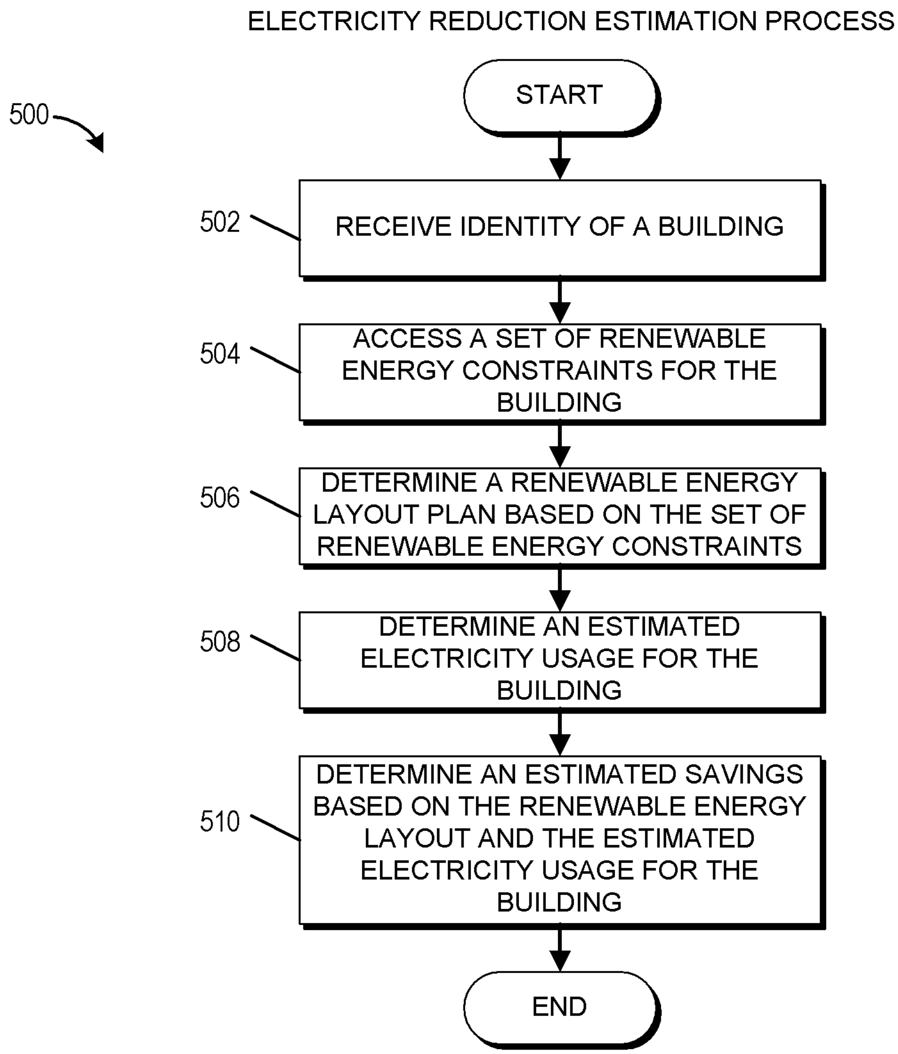
FIG. 5 is a flowchart for an embodiment of an electricity reduction estimation process.

FIG. 5 is a flowchart for an embodiment of an electricity reduction estimation process 500. The process 500 can be implemented by any system that can estimate the amount of savings associated with use of the renewable energy system configured using one or more of the processes 300 and 400. For example the process 500, in whole or in part, can be implemented by the renewable energy configuration and layout system 210, the renewable energy configurator 212, the electricity generation predictor 214, and/or the weather predictor 216, to name a few. Although any number of systems, in whole or in part, can implement the process 500, to simplify the discussion, portions of the process 500 will be described with reference to particular systems.

In certain embodiments, a user may determine whether to complete a transaction for a renewable energy system and/or for a building, or other property, based at least in part on an estimate of the electricity generated by the renewable energy system and/or an estimate of the savings to the user of the renewable energy system. One example non-limiting implementation of a process for determining the cost/benefit of the renewably energy system for a particular renewable energy system for a particular building is described with respect to the process 500.

The process 500 begins at block 502 where, for example, the configuration system 210 receives an identity of a building. The block 502 may include one or more of the embodiments described with respect to the block 302. At block 504, the configuration system 210 accesses a set of renewable energy constraints for the building. These renewable energy constraints may include constraints that affect the amount of energy or electricity produced by a renewable energy system or a portion thereof. Further, these renewable energy constraints may in some cases include constraints that do not affect the amount of energy electricity produced by the renewable energy system. In certain embodiments, the block 504 may include one or more of the embodiments described with respect to one or more of the blocks 304, 306, 308, or 404.

At block 506, the configuration system 210 determines a renewable energy layout plan based on the set of renewable energy constraints obtained at the block 504. In certain embodiments, the block 506 may include performing one or more of the operations associated with the process 300 and/or the process 400.

At block 508, the configuration system 210 determines an estimated electricity usage for the building. The block 508 may include accessing electricity usage information from the electricity consumption repository 222. Further, accessing electricity information from the electricity consumption repository 222 may include accessing information for similar buildings as the building identified in the block 502 within a particular geographic distance of the building. Buildings may be identified as similar based on one or more classification categories associated with the buildings. These classification categories may generally include, but are not limited to, characteristics that may impact the electricity consumption the buildings. For example, some non-limiting examples of the classification categories may include the size of the buildings, the purpose of the buildings, the year the buildings were constructed, materials used to construct the buildings, energy consuming features of the buildings (e.g., pools, heating, ventilation, and air-conditioning (HVAC) systems, outdoor cooking areas, fountains, etc.), the number of floors are stories within the buildings, and the like. Further, in some cases, the estimated electricity usage for the building may be based at least in part on demographic information associated with the potential occupants of the building. For example, electricity usage for a family of seven may be estimated as higher compared to the electricity usage for a family of four. Further, electricity usage for a pair of users in their 70s may be estimated differently than electricity usage for a pair of users in their 30s.

At block 510, the configuration system 210 determines an estimated savings for user associated with the building based at least in part on the renewable energy layout in the estimated electricity usage for the building. In certain embodiments, the estimated savings may be calculated over a particular time period. Further, estimated savings may be presented to a user to facilitate determining whether to obtain the renewable energy system and/or the building. In certain embodiments, the block 510 may include the value of the renewable energy system, or a portion thereof. For example, in a use case where the renewable energy system is obtained using a portion of a broker's commission for transfer of the building, the savings may include the cost or value of the renewable energy system. Further, in some cases, the block 510 may incorporate the change in value of building resulting from the installation of the renewable energy system in its determination of the estimated savings. For example, if the installation of the renewable energy system results in a 1% increase in the property value of the building, the estimated savings may incorporate the increase in the property value. In some embodiments, the estimated savings may be adjusted based on an anticipated change in the cost of electricity over a period of time and/or an anticipated change in the property value based on the renewable energy system over a period of time. For instance, the increase in property value from the renewable energy system may decrease over time due to a deterioration of the renewable energy system over time.

In certain embodiments, the block 510 may include determining an environmental impact from the use or installation of renewable energy system. Further, the block 510 may translate the environmental impact into a form that can be better understood by laypersons. For example, the configuration system 210 may convert a reduction in electricity usage from a polluting power plant to a number of trees planted or a number of oil barrels received, for a number of pounds of carbon dioxide reduced, or a reduction in a number of miles driven by a car.

In some embodiments, the configuration system 210 may determine the amount of energy or electricity produced or expected to be produced by the configured or suggested layout for the renewable energy system. This determination may be made based at least in part on the specifications for the selected components of the renewable energy system, the historical or predicted annual weather patterns and/or lifetime weather patterns, or any other factor that may impact electricity generation. Further, the configuration system 210 may determine an estimated electricity usage for the building to determine whether the renewable energy system will produce excess electricity that can be stored and/or sold back to the utility company, or will produce less than the amount of electricity expected to be used by occupants of the building. In some cases, the configuration system 210 can determine an expected added-value to the building that may result from the installation of the renewable energy system.

Example Use Case

In one example use case, a real estate broker can use the systems and methods disclosed herein to design a renewable energy system (e.g., a solar or photovoltaic system) for a building to provide free electricity to potential purchasers of the building. A user, such as the broker or a potential purchaser of the building, may conduct a search query based on one or more real estate criteria (e.g., location, number of bedrooms, bathrooms, price) which may result in the display of corresponding search results. The user may select a certain result or as an alternative provide the identity (e.g., an address) of the building to the configuration system 210. (The user does not need to select a specific result or identify a building in order for the system to operate. The system can generate a renewable energy design and determine the corresponding renewable energy information for all of the search query results, and then display the information for each search result.) The configuration system 210 can determine the eligibility for a PV system based on the property type, ownership or occupant status, the applicable laws/regulations/codes, and the minimum value of the property. The configuration system 210 can also determine the available area for installation of the PV system based on physical characteristics of the building obtained from the building data repository 224 (e.g., an MLS repository). Further, the configuration system 210 can estimate electricity consumption or usage for the building based at least in part on historical electricity usage of current or previous users of the building and/or of other buildings within a geographic area that share one or more characteristics with the building, such as size and/or usage type.

Using the estimated electricity consumption and the size of the building as determined from, for example, the building data repository 224, the configuration system 210 can determine a layout and size for a photovoltaic system. In some cases, this photovoltaic system may be the maximum or largest photovoltaic system that can be supported by the building. Further, the configuration system 210 may use one or more additional characteristics of the building that may affect electricity usage and/or the installation of the PV system to determine the layout and size for the PV system. For example, the one or more additional characteristics may include limitations imposed by a community association, the age of the building, obstructions (e.g., skylights, vents, etc.) in or near the surface available for installation of the PV system, building materials used in constructing the building, appliances included in the building, etc.

Moreover, as the broker desires to provide free electricity to the potential purchasers of the building, the configuration system 210 may use a commission provided to the broker as an additional constraint for the photovoltaic system. Thus, assuming the commission for the broker is a percentage of the value of the building, the configuration system 210 may estimate a value for the building. Using the estimated value for the building, the configuration system 210 may estimate a commission value for the broker. Further, using the commission value and a determined cost for obtaining and installing the photovoltaic system, the configuration system 210 can modify the layout in size for the photovoltaic system based on an additional constraint of the commission value. In other words, the layout in size of the PV system may be adjusted to reduce the cost of the PV system to satisfy or to not exceed the commission value. In some cases, adjusting the size of the PV system includes accounting for a number of inverters required for the PV system. In some implementations, it may be more cost-effective to include fewer solar panels so as to reduce the number of inverters.

Alternatively, or in addition, the configuration system 210 can use region-specific laws or regulations as a constraint in designing the PV system. For instance in some states, the law may require an increased fee for properties that include a PV system to help offset the loss in funds to the utility company for maintenance of the power grid infrastructure. This can also be the case for permit, inspection, or grid interconnection fees. In such states or municipalities, the size of the PV system may be adjusted to accommodate the extra fee. Additionally, in some cases, local building codes may require that PV arrays provide a path of travel or setback from the roof line. In such cases, the size of the PV system may be adjusted to accommodate the building or safety code.

With some properties, a PV system may already exist. In some such cases, the configuration system 210 may determine whether the existing PV system can be expanded to provide additional electricity. Further, the configuration system 210 may determine whether the existing PV system is expected to satisfy 100% of the electricity demand for the building. If so, the configuration system 210 may omit generating the layout for a PV system. If not, the configuration system 210 may generate a layout for a second PV system or for expanding the existing PV system to satisfy a greater portion of the electricity demand for the building than the existing PV system.

In certain embodiments, the size of the PV system that can be provided for free is insufficient to provide the total electricity for the building. In some such cases, the difference may be presented to a user. Further, the user may have the opportunity to select a larger PV system that is capable of providing the total electricity for the building. In some such cases, the user may pay the difference in the cost of the PV system. In other cases, the larger PV system may be provided for free in exchange for the sale of excess electricity being provided to the broker or to a third-party investor.

Typically, PV systems generate direct current (DC) and may be sized accordingly. However, as the standard in most geographic areas is to use alternating current (AC), the calculated size of the PV system in terms of DC energy produced may be converted to AC using a DC to AC conversion ratio. The DC to AC conversion ration may be derived from equipment technical specifications, such as module PTC rating and inverter efficiency.

As previously stated, the PV system may be modified in size to account for an additional constraint, which in this non-limiting use case example may be the total estimated commission for the broker from a real estate transaction. In some cases, the broker may wish to sell the renewable energy system for a particular price. Certain embodiments herein are capable of determining the cost of the proposed renewable energy system and setting the price based on desired margins, market value, or some other determining factor. The availability of incentives, such as government tax credits and grants or utility company rebates, may be used as additional considerations for determining cost and price. The cost and/or price may be used as additional constraints to the PV system size. The configuration system 210 may determine a total cost of the modified PV system based on the size of the modified PV system, cost for the PV system as well as related costs, such as for the inverter and for design, engineering, and installation. This cost information may be obtained, for example, from the renewable energy source provider system 228, labor cost repository, municipal fee repository, average or market price for renewable energy systems, etc.

Further, the configuration system 210 may determine an estimated production for the modified PV system over a particular time period, such as monthly, annually, or for the lifetime of the PV system. In some cases, the lifetime of the PV system may be determined based on manufacturer specifications. In other cases, the lifetime of the PV system may be determined based on a length of the warranty for the PV system. In yet other cases, lifetime of the PV system may be determined based on an anticipated deterioration rate of the solar panels.

In addition, the configuration system 210 may determine an estimated electricity bill savings for the building over a particular time period, such as monthly, annually, or for the lifetime of the PV system. This estimated electricity bill savings may be based at least in part on the rate schedule of a utility company, anticipated weather patterns, anticipated climate change, and/or anticipated electricity usage by users based at least in part on electricity usage of users in buildings with characteristics in common with building receiving the PV system.

Furthermore, the configuration system 210 may determine in estimated increase in the value of the building with the installation of the PV system based at least in part on the property value of buildings with a PV system in buildings without a PV system that share one or more characteristics of the building receiving the PV system. In some cases, additional incentives, tax credits, grants, and/or rebates may be obtained for installation of the PV system. For example, rebates may be obtained from one or more governmental organizations and/or from the utility company. In addition, in some cases, excess electricity may be sold to the utility company. In certain embodiments, the one or more rebates and/or the expected sale of excess electricity may be used to further offset the cost of the PV system. In some such cases, the configuration system 210 may modify the size of the PV system based at least in part on the one or more rebates and/or the expected sale of excess electricity.

In some embodiments, the configuration system 210 may determine the environmental impact of benefits of installing the PV system. This information along with the size of the PV system in the electricity savings may be presented to potential purchasers of the building. By presenting the environmental benefits as well as electricity cost savings to potential purchasers, purchasers may be incentivized to purchase the building with the PV system. Advantageously, in certain embodiments, incentivizing users to purchase buildings with PV systems can reduce climate change by reducing the amount of electricity produced from polluting sources, such as coal power plants.

Figure 6:
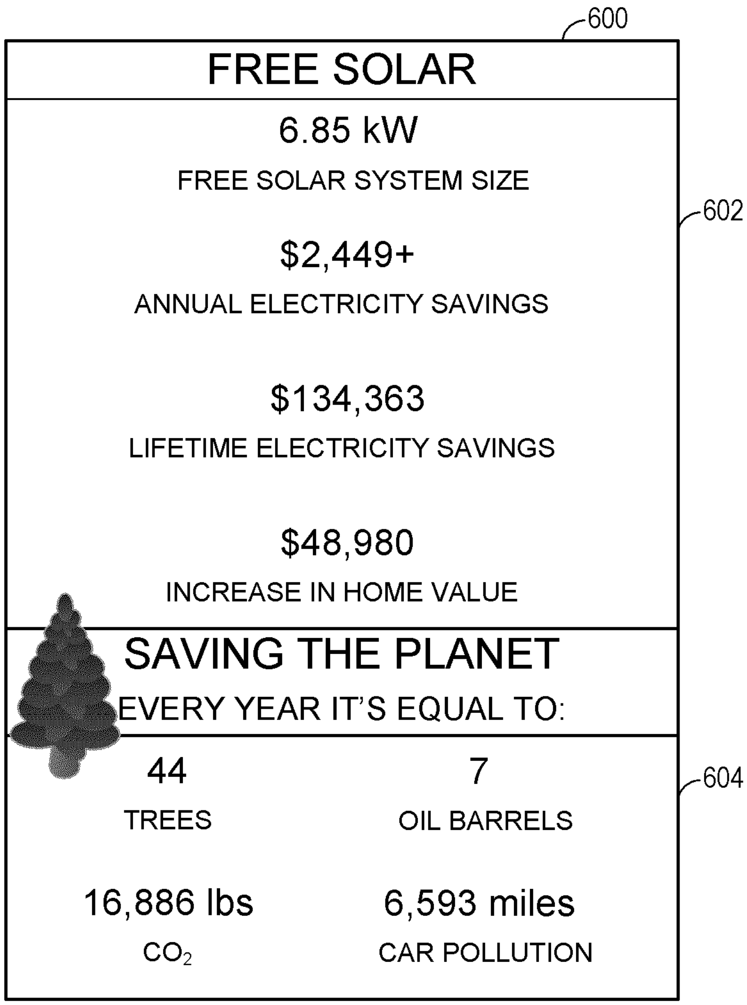
FIG. 6 is an example of a user interface for presenting electricity savings to a user based on embodiments of the features disclosed herein.

FIG. 6 is an example of a user interface 600 for presenting electricity savings to a user based on embodiments of the features disclosed herein. As illustrated, the user interface 600 may include a panel 602 that can present the user with the economic benefits of the renewable energy system. Further, the user interface 600 may include a panel 604 that can present the user with the environmental benefits of the renewable energy system.

In another use case, a potential purchaser can browse for a property to purchase using a brokerage network page, or other network page that can present properties available for acquisition as either a purchase or lease. As the potential purchaser views various properties, the potential purchaser may view instances of the user interface 600 to determine the potential solar system that may be included with an acquisition of the property. Further, the potential purchaser may be informed of the amount of electricity that can be generated and its value using the solar system provided with the property. In addition, the impact on the environment may be present to the potential purchaser, or user, enabling the user to utilize this information in making an acquisition decision regarding the property.

In certain embodiments, the information for the solar system may be stored within a repository, which may include a size and capacity for a solar system specific to different properties. This information may be retrieved from the repository for presentation to the user in response to the user selecting the property to view from the brokerage network page. Alternatively, or in addition, the information for the solar system may be generated automatically in response to the user selecting the property to view from the brokerage network page. Advantageously, in certain embodiments, by generating the information relating to the solar system in response to the user selecting the property, a more accurate estimate of the potential benefits of the free or discounted solar system may be presented to the user compared to a previously generated solar system design. For instance, the solar system may be designed to take into account changes in availability of solar system components or to account for user-specific constraints specified by the user, such as aesthetic constraints.

Additional Renewable Energy System Design Embodiments

Embodiments of the present disclosure provide a computer-implemented tool for facilitating the electrical design of a renewable energy system or an energy generation system. In one embodiment, the tool can be implemented as a standalone (e.g., desktop) software application configured to run autonomously on one or more computing devices, such as the configuration system 210. In another embodiment, the tool can be implemented as a distributed software application hosted on, e.g., a network or application server. In operation, the configuration system 210 can generate a graphical user interface configured to request, from a user, initial information pertaining to an energy generation system to be installed at a customer site, such as a building, a plurality of buildings, or a farm, etc. Once received, the configuration system 210 can use the initial information, in conjunction with an electrical data model, a decision tree, and additional information retrieved from one or more external data sources, to determine an electrical design for installing the energy generation system at the customer site. An installation diagram can then be generated that illustrates the determined electrical design. This installation diagram may be provided to a renewable energy system provider via, for example, the renewable energy source provider system 228. In some cases, the installation diagram may be automatically generated. Further, the installation diagram may be automatically provided to the renewable energy system provider initiating the manufacture and installation of the building specific renewable energy system.

Advantageously, in certain embodiments, with the foregoing features, there is no need for an experienced engineer or system designer to manually select each electrical component of a system installation, or manually determine how those components should be interconnected. Instead, all or a part of this process can be automated. Thus, embodiments of the present disclosure empower a wide range of users, regardless of their technical expertise or experience, to quickly and easily create an electrical system design. For example, a property broker, a property purchaser, and/or a property seller can design or cause to be designed a renewable energy system for a building or other property based at least in part on one or more data sources and/or one or more building specific constraints.

Further, by relying on a standard electrical data model and by retrieving information from external data sources (such as an authority having jurisdiction (AHJ), utility, MLS, and/or state databases), the configuration system 210 described above can ensure that the generated electrical design conforms to the various electrical/building requirements (e.g., National Electrical Code (NEC), AHJ regulations, etc.) that apply to the customer site.

Moreover, the installation diagram generated by the configuration system 210 can be formatted to simplify installation of the renewable energy system and the obtaining of components for the renewable energy system. For example, in one embodiment, direct current (DC) components of the system (e.g., PV Modules) can be grouped together and alternating current (AC) components (e.g., Inverters) can be grouped separately. Advantageously, in certain embodiments, the generated renewable energy system design can enable multiple installation crews to divide the design and concurrently work on the AC and DC aspects of the renewable energy system. In another embodiment, the diagram can identify the make and model of each electrical component, as well as the interconnect component (e.g., wires) sizes for interconnecting the components. Thus, all of the information needed to procure the electrical components from the supply chain can be gleaned directly from the diagram itself, rather than being collected from other sources/locations. In one embodiment, the component information can be included in metadata associated with the installation diagram (in addition to being displayed on the diagram). This information can then be transferred directly into, e.g., an inventory management system or a renewable energy source provider system 228.

Additional Embodiments

A number of additional embodiments may be enabled by the systems and methods disclosed herein. For example, in certain embodiments, a method is disclosed that includes receiving, by a renewable energy configuration system comprising one or more hardware processors and configured with specific computer-executable instructions, an identifier corresponding to a building. Further, the method may include accessing, by the renewable energy configuration system, physical characteristics for the building from a building information repository. The physical characteristics may be identified based at least in part on the identifier (e.g., the name of a sub-division or an address for the building). Moreover, the method can include obtaining, by the renewable energy configuration system, average historical electricity usage for additional buildings associated with a classification of the building within a geographic area that includes the building. The method may also include determining, by the renewable energy configuration system, a first size for a first photovoltaic system (PV) for the building based at least in part on the physical characteristics for the building and the average historical electricity usage for the additional buildings. Further, the method may include determining, by the renewable energy configuration system, a non-energy based constraint for configuration of the photovoltaic system. The non-energy based constraint may be specific to the building. For example, the non-energy based constraint may be based on the aesthetics of the building or an available rebate or commission that is specific to the building. In addition, after determining the non-energy based constraint, the method may include determining, by the renewable energy configuration system, a second size for a second PV system based at least in part on the non-energy based constraint. This second size may be specified based on a direct current (DC) energy unit. Moreover, the method may include determining whether the second PV system is smaller than the first PV system. In response to determining that the second PV system is smaller than the first PV system, the method may further include converting, by the renewable energy configuration system, the second size for the second PV system to a third size for the second PV system based on an alternating current (AC) energy unit using a DC to AC conversion ratio. In addition, the method may include calculating a constraint factor for the second PV system based at least in part on the second size. Further, the method may include determining a constraint satisfaction value based at least in part on the non-energy based constraint and the constraint factor. Moreover, the method may include determining an anticipated annual electricity production for the second PV system using the third size for the second PV system. The method may further include determining an anticipated impact on the constraint satisfaction factor resulting from installation of the second PV system based at least in part on the anticipated annual electricity production to obtain an updated constraint satisfaction factor. Also, the method may include determining whether the updated constraint satisfaction factor satisfies a constraint limit threshold. In response to determining that the updated constraint satisfaction factor satisfies the constraint limit threshold, the method may include automatically selecting a number of PV components for installation. These PV components can include at least a number of PV panels, a number of inverters, and/or a number of PV panel installation frames. Further, the method may include sizing the PV components based at least in part on the third size for the second PV system. In addition, the method may include initiating installation of the second PV system.

In some implementations, the method the non-energy based constraint is based at least in part on an environmental impact associated with installation of the second PV system. Further the selection of the PV components may be based at least in part on the non-energy based constraint.

Certain embodiments described herein relate to a method that includes receiving, by a renewable energy configuration system comprising one or more hardware processors and configured with specific computer-executable instructions, an identifier corresponding to a building. Further the method may include accessing, by the renewable energy configuration system, physical characteristics for the building from a building repository. The physical characteristics may be identified based at least in part on the identifier. In addition, the method may include determining, by the renewable energy configuration system, a first layout for a renewable energy system based at least in part on the physical characteristics for the building. The first layout may correspond to a maximally sized renewable energy system for the building and/or the largest sized renewable energy system capable of being installed on the building. In addition, the method may include receiving, by the renewable energy configuration system, a non-energy based constraint for installation of the renewable energy system. The non-energy based constraint may be specific to the building. In some cases, the non-energy based constraint may be specific to buildings of a particular category. Moreover, the method may include modifying, by the renewable energy configuration system, the first layout for the renewable energy system based at least in part on the non-energy based constraint to obtain a second layout for the renewable energy system. The second layout may be smaller than the maximally sized renewable energy system. Furthermore, the method may include initiating installation of the second layout for the renewable energy system.

In some implementations, the non-energy based constraint comprises an aesthetic constraint and/or a purpose for the building. Further, the non-energy based constraint may include a structural condition of the building. This structural condition may correspond to a percentage of an available footprint, or area of the building, for installation of the renewable energy system that is capable of supporting the renewable energy system.

In addition, the method may include accessing electricity consumption data for a plurality of buildings that share a classification with the building. The plurality of buildings may be located within a threshold area of the building. Further, determining the first layout for the renewable energy system can be further based at least in part on the electricity consumption data. In some cases, the method may include accessing weather data for a geographic area that includes the building. In some such cases, determining the first layout for the renewable energy system is further based at least in part on the weather data. In some cases, the weather data may include anticipated climate change patterns over a time period. Further, the method may include modifying the first layout based at least in part on the anticipated climate change patterns.

In some implementations, initiating the installation of the second layout for the renewable energy system may include electronically providing the second layout to a renewable energy installation entity. Furthermore, the renewable energy system may be a photovoltaic (PV) system that can include a plurality of PV panels. In some such cases, modifying the first layout for the renewable energy system based at least in part on the non-energy based constraint may include modifying a size of at least some of the plurality of PV panels. Further, the second layout can include a plurality of heterogeneously sized PV panels.

Certain implementations of the method may further include accessing energy-usage features data for the building from the real-estate repository. In some such cases, modifying the first layout for the renewable energy system to obtain the second layout may further include modifying the first layout based at least in part on the energy-usage features data. The energy-usage features data can include an identity of one or more features of the building that impact expected energy usage by a user associated with the building. The first layout and the second layout for the renewable energy system may be automatically generated without input from a user.

Aspects of the present disclosure relates to a system that can include an electronic data store configured to store constraint data. Further, the system may include a hardware processor in communication with the electronic data store. The hardware processor may be configured to execute specific computer-executable instructions to at least access physical characteristics for a building from a building repository and identify portions of the building capable of supporting a renewable energy system based at least in part on the physical characteristics of the building. Moreover, the hardware processor can determine an initial configuration for the renewable energy system based at least in part on the identified portions of the building capable of supporting the renewable energy system. The initial configuration may be selected based at least in part on an amount of electricity generated. In addition, the hardware processor can receive an identity of a non-energy based constraint for installation of the renewable energy system. The non-energy based constraint may be specific to the building. Furthermore, the hardware processor can access the electronic data store to obtain constraint data associated with the identified non-energy based constraint. In addition, the hardware processor may modify the initial layout for the renewable energy system based at least in part on the constraint data to obtain a modified layout for the renewable energy system. The modified layout for the renewable energy system can be generated automatically without user input.

In some implementations, the modified layout for the renewable energy system produces less electricity that the initial configuration. Furthermore, in some cases, the physical characteristics of the building and the non-energy based constraint are weighted. Moreover, the hardware processor may be further configured to execute specific computer-executable instructions to at least access electricity consumption data for a plurality of buildings that share a classification with the building and determine an anticipated electricity consumption value for the building based, at least in part, on the electricity consumption data for the plurality of buildings. Furthermore, the initial layout of the renewable energy system may be modified based at least in part on the anticipated electricity consumption value and the constraint data.

In certain embodiments, the anticipated electricity consumption value and the constraint data may be weighted differently when modifying the initial layout of the renewable energy system. Moreover, the hardware processor can be further configured to execute specific computer-executable instructions to at least access climate change data for a geographic area that includes the building. The anticipated electricity consumption may be determined based at least in part on the climate change data. In addition, the hardware processor may be further configured to execute specific computer-executable instructions to at least identify one or more energy usage features of the building that exceed an energy usage threshold. The anticipated electricity consumption can be determined based at least in part on one or more energy usage features. Furthermore, the hardware processor may be further configured to execute specific computer-executable instructions to at least output the modified layout of the building to a user accessing data associated with the building on building broker network page.

Certain aspects of the present disclosure relate to a non-transitory computer-readable storage medium storing computer executable instructions that, when executed by one or more computing devices, configure the one or more computing devices to perform operations comprising accessing a plurality of independent data sources to identify a plurality of characteristics for a building and a plurality of characteristics for a geographic area including the building. Furthermore, the operations may include weighting the plurality of characteristics for the building and the plurality of characteristics for the geographic area. In addition, the operations may include determining an initial configuration for a renewable energy system based at least in part on the weighted plurality of characteristics for the building and the weighted characteristics for the geographic area. The initial configuration can be selected based at least in part on an amount of electricity generated. Furthermore, the operations may include receiving non-energy based constraint data for the renewable energy system. This non-energy based constraint data may be specific to the building. In addition, the operations may further include modifying the initial layout for the renewable energy system based at least in part on the non-energy based constraint data to obtain a modified layout for the renewable energy system.

Certain aspects of the present disclosure relate to a method that includes receiving, by a computer system from a user, first information pertaining to a renewable energy system to be installed at a building. Further, the method may include determining, by the computer system, an electrical design for installing the renewable energy system at the building. The determining may be based on the first information, second information retrieved from one or more external data sources, an electrical data model, and a decision tree modeling an electrical design process. The decision tree may comprise a series of decisions and decision outcomes that guide the computer system on what electrical components may be used to implement the renewable energy system and how the electrical components may be interconnected. The electrical components can include at least one inverter, one or more alternating current (AC) components, and one or more direct current (DC) components. In addition, the method may include generating, by the computer system, an installation diagram illustrating the determined electrical design.

In certain embodiments, the one or more external data sources may include a building data repository, an electrical component repository including information relating to the available electrical components for designing the renewable energy system, a weather data repository, a mapping repository that includes geographic information for an area that includes the building, and any other information repository that may include information for designing the renewable energy system for installation at the building. In some implementations, the renewable energy system is designed to satisfy one or more government regulations relating to the installation, design, and maintenance of an electric systems and/or a renewable energy system.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, “can,” “could,” “might” or “may,” unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase “at least one of X, Y, or Z,” unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method comprising:

receiving, by a renewable energy configuration system comprising one or more hardware processors and configured with specific computer-executable instructions, an identifier corresponding to a building;

accessing, by the renewable energy configuration system, physical characteristics for the building from a building information repository, the physical characteristics being identified based at least in part on the identifier;

obtaining, by the renewable energy configuration system, average historical electricity usage for additional buildings associated with a classification of the building within a geographic area that includes the building, wherein the classification is associated with one or more of: amenities associated with the building, demographics of one or more occupants of the building, or materials used to construct the building;

determining, by the renewable energy configuration system, a first size for a first photovoltaic system (PV) for the building based at least in part on the physical characteristics for the building and the average historical electricity usage for the additional buildings, wherein the renewable energy configuration system uses a first machine learning generated parameter function to determine a layout for the first PV system based at least in part on the physical characteristics for the building and the average historical electricity usage for the additional buildings;

determining, by the renewable energy configuration system, a non-energy based constraint for configuration of the photovoltaic system, the non-energy based constraint specific to the building;

after determining the non-energy based constraint, determining, by the renewable energy configuration system, a second size for a second PV system based at least in part on the non-energy based constraint, the second size specified based on a direct current (DC) energy unit, wherein the renewable energy configuration system uses a second machine learning generated parameter function to determine a layout for the second PV system based at least in part on the non-energy based constraint, and wherein the non-energy based constraint includes at least an allocation of space within the layout for the second PV system for a secondary structure independent of the second PV system;

determining whether the second PV system is smaller than the first PV system; and in response to determining that the second PV system is smaller than the first PV system:

converting, by the renewable energy configuration system, the second size for the second PV system to a third size for the second PV system based on an alternating current (AC) energy unit using a DC to AC conversion ratio;

calculating a constraint factor for the second PV system based at least in part on the second size;

determining a constraint satisfaction value based at least in part on the non-energy based constraint and the constraint factor;

determining an anticipated annual electricity production for the second PV system using the third size for the second PV system;

determining an anticipated impact on the constraint satisfaction value resulting from installation of the second PV system based at least in part on the anticipated annual electricity production to obtain an updated constraint satisfaction value;

determining whether the updated constraint satisfaction value satisfies a constraint limit threshold; and in response to determining that the updated constraint satisfaction value satisfies the constraint limit threshold:

automatically selecting a number of PV components for installation, the PV components including at least a number of PV panels, a number of inverters, or a number of PV panel installation frames;

sizing the PV components based at least in part on the third size for the second PV system; and initiating installation of the second PV system.

2. The method of claim 1, wherein the non-energy based constraint is based at least in part on an environmental impact associated with installation of the second PV system.

3. The method of claim 1, wherein the selection of the PV components is based at least in part on the non-energy based constraint.

4. A method comprising:

receiving, by a renewable energy configuration system comprising one or more hardware processors and configured with specific computer-executable instructions, an identifier corresponding to a building;

accessing, by the renewable energy configuration system, physical characteristics for the building from a building repository, the physical characteristics being identified based at least in part on the identifier;

determining, by the renewable energy configuration system, a first layout for a renewable energy system based at least in part on the physical characteristics for the building, the first layout corresponding to a maximally sized renewable energy system for the building, wherein the renewable energy configuration system uses a first machine learning generated parameter function to determine the first layout for the renewable energy system based at least in part on the physical characteristics for the building;

receiving, by the renewable energy configuration system, a non-energy based constraint for installation of the renewable energy system, the non-energy based constraint specific to the building;

modifying, by the renewable energy configuration system, the first layout for the renewable energy system based at least in part on the non-energy based constraint to obtain a second layout for the renewable energy system, the second layout comprising a less than maximally sized renewable energy system, wherein the renewable energy configuration system uses a second machine learning generated parameter function to determine the second layout based at least in part on the non-energy based constraint; and initiating installation of the second layout for the renewable energy system.

5. The method of claim 4, wherein the non-energy based constraint comprises one or more of an aesthetic constraint or a purpose for the building.

6. The method of claim 4, wherein the non-energy based constraint comprises a structural condition of the building, the structural condition corresponding to a percentage of an available footprint for installation of the renewable energy system that is capable of supporting the renewable energy system.

7. The method of claim 4, further comprising accessing electricity consumption data for a plurality of buildings that share a classification with the building, wherein the plurality of buildings are located within a threshold area of the building, and wherein determining the first layout for the renewable energy system is further based at least in part on the electricity consumption data.

8. The method of claim 4, further comprising accessing weather data for a geographic area that includes the building, wherein determining the first layout for the renewable energy system is further based at least in part on the weather data.

9. The method of claim 8, wherein the weather data comprises anticipated climate change patterns over a time period, and wherein the method further comprises modifying the first layout based at least in part on the anticipated climate change patterns.

10. The method of claim 4, wherein initiating the installation of the second layout for the renewable energy system comprises electronically providing the second layout to a renewable energy installation entity.

11. The method of claim 4, wherein the renewable energy system comprises a photovoltaic (PV) system comprising a plurality of PV panels, wherein modifying the first layout for the renewable energy system based at least in part on the non-energy based constraint comprises modifying a size of at least some of the plurality of PV panels, and wherein the second layout comprises a plurality of heterogeneously sized PV panels.

12. The method of claim 4, further comprising accessing energy-usage features data for the building from the real-estate repository and modifying the first layout for the renewable energy system to obtain the second layout further comprises modifying the first layout based at least in part on the energy-usage features data, wherein the energy-usage features data includes an identity of one or more features of the building that impact expected energy usage by a user associated with the building.

13. The method of claim 4, wherein the first layout and the second layout for the renewable energy system are automatically generated without input from a user.

14. A system comprising:

an electronic data store configured to store constraint data;

a hardware processor in communication with the electronic data store, the hardware processor configured to execute specific computer-executable instructions to at least:

access physical characteristics for a building from a building repository;

identify portions of the building capable of supporting a renewable energy system based at least in part on the physical characteristics of the building;

determine an initial layout for the renewable energy system based at least in part on the identified portions of the building capable of supporting the renewable energy system, the initial layout selected based at least in part on an amount of electricity generated, wherein the hardware processor uses a first machine learning generated parameter function to determine the initial layout for the renewable energy system;

receive an identity of a non-energy based constraint for installation of the renewable energy system, the non-energy based constraint specific to the building;

access the electronic data store to obtain constraint data associated with the identified non-energy based constraint;

modify the initial layout for the renewable energy system based at least in part on the constraint data to obtain a modified layout for the renewable energy system, the modified layout for the renewable energy system generated automatically without user input, wherein the modified layout for the renewable energy system produces less electricity than the initial layout, and wherein the hardware processor uses a second machine learning generated parameter function to determine the modified layout for the renewable energy system based at least in part on the constraint data; and output, for display to a user, instructions associated with initiating installation of the modified layout for the renewable energy system.

15. The system of claim 14, wherein the physical characteristics of the building and the non-energy based constraint are weighted.

16. The system of claim 14, wherein the hardware processor is further configured to execute specific computer-executable instructions to at least:

access electricity consumption data for a plurality of buildings that share a classification with the building; and determine an anticipated electricity consumption value for the building based, at least in part, on the electricity consumption data for the plurality of buildings, wherein the initial layout of the renewable energy system is modified based at least in part on the anticipated electricity consumption value and the constraint data.

17. The system of claim 16, wherein, when modifying the initial layout of the renewable energy system, the anticipated electricity consumption value is associated with a first weight and the constraint data is associated with a second weight, the first weight and the second weight comprising different weights.

18. The system of claim 16, wherein the hardware processor is further configured to execute specific computer-executable instructions to at least access climate change data for a geographic area that includes the building, wherein the anticipated electricity consumption is determined based at least in part on the climate change data.

19. The system of claim 16, wherein the hardware processor is further configured to execute specific computer-executable instructions to at least identify one or more energy usage features of the building that exceed an energy usage threshold, wherein the anticipated electricity consumption is determined based at least in part on one or more energy usage features.

20. The system of claim 16, wherein the hardware processor is further configured to execute specific computer-executable instructions to at least output the modified layout of the renewable energy system to a user accessing data associated with the building on building broker network page.

* * * * *